(12) United States Patent  
Bisberg

(10) Patent No.: US 7,791,089 B2  
(45) Date of Patent: Sep. 7, 2010

(54) LED PACKAGING METHODS AND LED-BASED LIGHTING PRODUCTS

(75) Inventor: Jeffrey Bisberg, Boulder, CO (US)

(73) Assignee: AlbEO Technologies, Inc., Boulder, CO (US)

( * ) Notice: Subject to any disclaimer, the term of this patent is extended or adjusted under 35 U.S.C. 154(b) by 96 days.

(21) Appl. No.: 12/198,662

(22) Filed: Aug. 26, 2008

(65) Prior Publication Data

US 2010/0053929 A1    Mar. 4, 2010

(51) Int. Cl.  
*H01L 33/00* (2010.01)

(52) U.S. Cl. .............................. 257/88; 257/98; 257/99; 257/100; 257/E33.056

(58) Field of Classification Search .................. 257/88, 257/98, 99, 100, E33.056  
See application file for complete search history.

(56) References Cited

U.S. PATENT DOCUMENTS

2009/0267085 A1 * 10/2009 Lee et al. ....................... 257/88

* cited by examiner

*Primary Examiner*—Hoai v Pham  
(74) *Attorney, Agent, or Firm*—Lathrop & Gage LLP

(57) ABSTRACT

A method of packaging a light-emitting diode (LED) chip includes coupling the LED chip to a printed circuit board (PCB) and forming a conductor on a cover plate. Conductive epoxy is applied to at least one of the LED chip and the conductor. The cover plate is coupled to the PCB such that the conductive epoxy forms a circuit connection between the LED chip and the conductor. An LED-based lighting product includes a PCB with one or more LED chips mounted directly thereon. A cover plate has conductors that couple at least to the one or more LED chips and to the PCB, such that the conductors form electrical connections between the one or more LED chips and the PCB.

19 Claims, 11 Drawing Sheets

LED PACKAGING METHODS AND LED-BASED LIGHTING PRODUCTS

BACKGROUND

Light-emitting diode ("LED") based lighting is increasingly used in both commercial and domestic settings due to its efficiency, flexibility and low toxic material content. Solid-state LEDs are generally manufactured and packaged like other semiconductor products; that is, the LEDs are first fabricated in wafer form, then wafers are diced into individual LED chips that are assembled into individual packages. The packages then mount into products in a variety of ways. In this way, packaging cost is incurred for each individual LED, with this cost accumulating in each product that uses the LEDs.

Net brightness from a single point source is also an issue with LED based lighting. Management of manufacturing costs currently favors use of large LED chips (e.g., packaged chips that consume about one watt of electrical power and emit about 80 lumens of light) but users sometimes find the large LED chips uncomfortably bright. Managing heat transfer away from large LED chips may also be problematic.

SUMMARY

In an embodiment, a method of packaging a light-emitting diode (LED) chip includes coupling the LED chip to a printed circuit board (PCB) and forming a conductor on a cover plate. Conductive epoxy is applied to at least one of the LED chip and the conductor. The cover plate is coupled to the PCB such that the conductive epoxy forms a circuit connection between the LED chip and the conductor.

In an embodiment, a LED-based lighting product includes a PCB with one or more LED chips mounted directly thereon. A cover plate has conductors that couple at least to the one or more LED chips and to the PCB, such that the conductors form electrical connections between the one or more LED chips and the PCB.

DETAILED DESCRIPTION OF DRAWINGS

Figure 1:
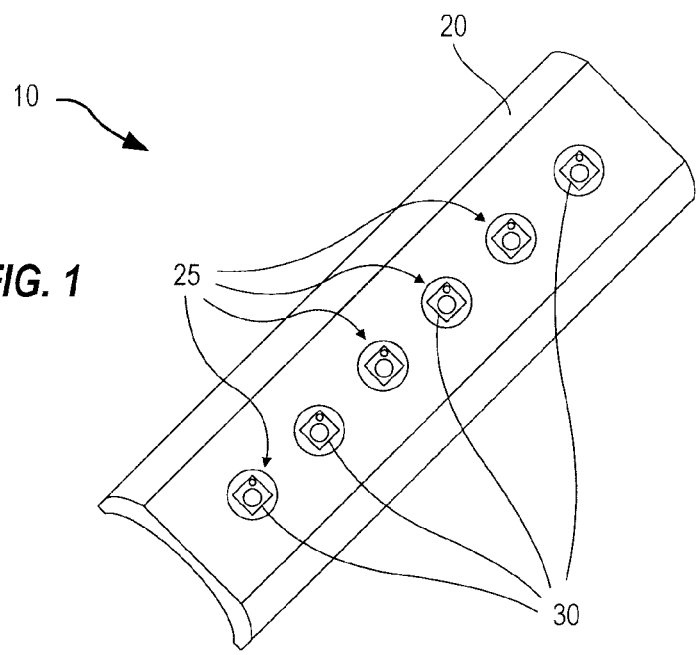
FIG. 1 shows an LED-based lighting product, in accord with an embodiment.

The present disclosure may be understood by reference to the following detailed description taken in conjunction with the drawings described below. It is noted that, for purposes of illustrative clarity, certain elements in the drawings may not be drawn to scale. Specific instances of an item may be referred to by use of a numeral in parentheses (e.g., PCB assemblies 200(1), 200(2)) while numerals without parentheses refer to any such item (e.g., PCB assembly 200). Certain drawings label only representative instances of an element, for illustrative clarity.

FIG. 1 shows an LED-based lighting product 10. Lighting product 10 includes a plurality of LED chips 30 that emit light through apertures 25 of a housing 20. Housing 20 may be a metal rail as shown, but may alternatively be of any desired form or material, and may include translucent or transparent materials for LED chips 30 to emit light through, in which case housing 20 need not include apertures 25.

Figure 2:
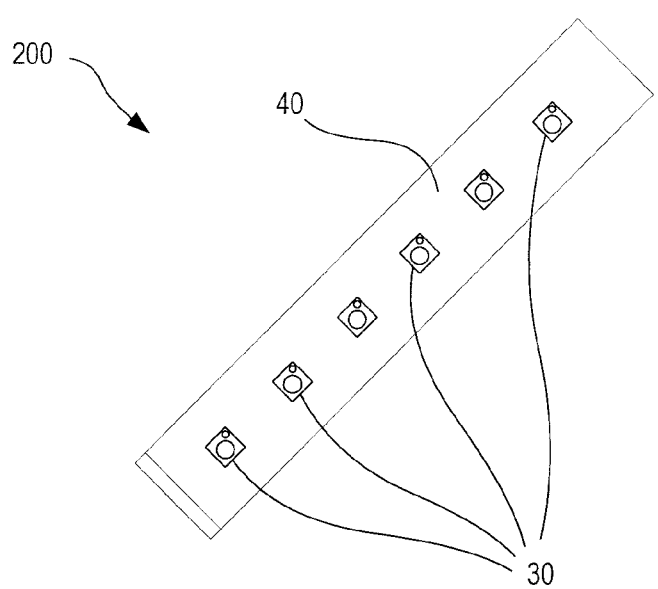
FIG. 2 shows a printed circuit board ("PCB") assembly with LED chips assembled thereon, in accord with an embodiment.

FIG. 2 shows a printed circuit board ("PCB") assembly 200 with LED chips 30 assembled thereon. PCB assembly 200 includes a PCB 40 to which LED chips 30 mount. PCB assembly 200 is an example of a PCB assembly that may be utilized within LED-based lighting product 10.

Figure 3:
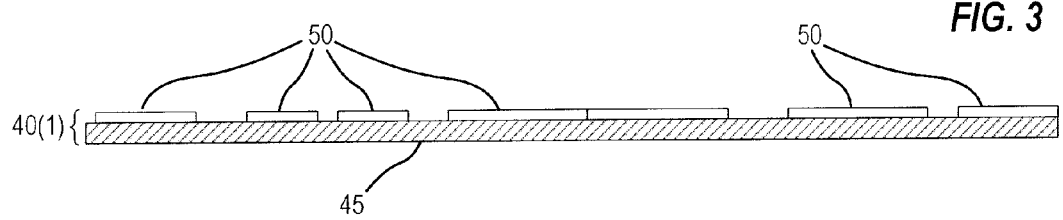
FIG. 3 illustrates an early stage of fabrication of a PCB, in accord with an embodiment.

FIG. 3 illustrates an early stage of fabrication of a PCB 40(1). PCB 40(1) includes a substrate 45 and conductors 50. Substrate 45 may be of known PCB substrate materials; for example, woven glass impregnated with epoxy (sometimes sold under the trade name "FR4"), cotton paper or matte glass impregnated with epoxy, woven glass impregnated with polyester. Conductors 50 may be metal, and for example may be thick copper traces that support thermal transfer in addition to electrical connectivity. Conductors 50 are formed on substrate 45 using known methods of PCB fabrication. Other features may also be formed on substrate 45, for example fiducial marks may be formed for later use in aligning LED chips 30, or cover plate subassemblies (see for example FIG. 6A, FIG. 6B, FIG. 9B, FIG. 11B, FIG. 12C and FIG. 14C) with PCB 40(1).

Figure 4:
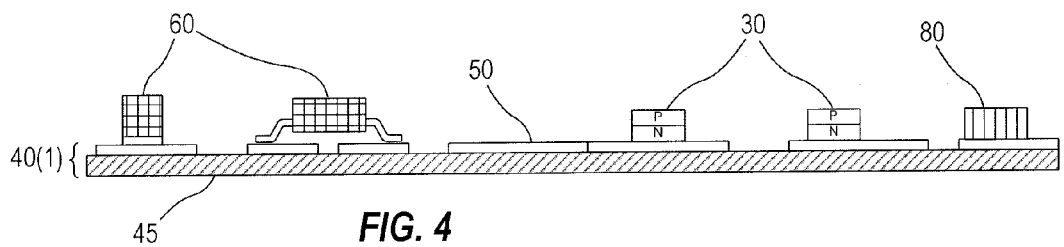
FIG. 4 illustrates components mounted to the PCB of FIG. 3, in accord with an embodiment.

FIG. 4 illustrates components mounted to PCB 40(1), including circuit components 60, LED chips 30 and a standoff 80 that provides electrical and/or mechanical support for a cover plate or cover plate subassembly, as will be shown in FIGS. 5 through 8B. Circuit components 60, LED chips 30 and standoff 80 may be soldered, or mounted with conductive epoxy, to conductors 50 (not all conductors 50 are labeled in FIG. 4, for clarity of illustration). Circuit components 60 may, for example, regulate power supplied to LED chips 30. When conductive epoxy is utilized, the epoxy may be hardened by a thermal bake or by using ultraviolet ("UV") light. LED chips 30 are schematically shown as having an N region at a bottom side of each chip and a P region at a top of each chip, and the assembly sequence shown in FIG. 3 through FIG. 8B utilize one backside electrical contact and one frontside electrical contact. However, the P and N regions may be reversed from the order illustrated, and an LED chip 30 may have both P and N contacts on a top surface and that both such contacts may couple with conductors of a cover plate subassembly using the methods discussed below (in connection with FIG. 12A through FIG. 12C, for example).

Figure 5A:
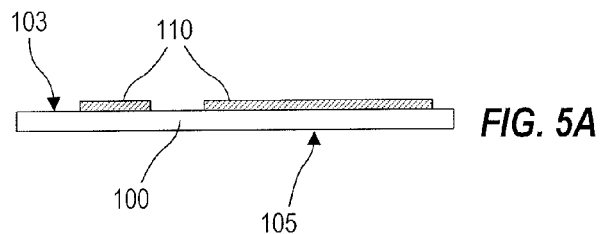
FIG. 5A is a side view of a cover plate with conductors, in accord with an embodiment.
Figure 8A:
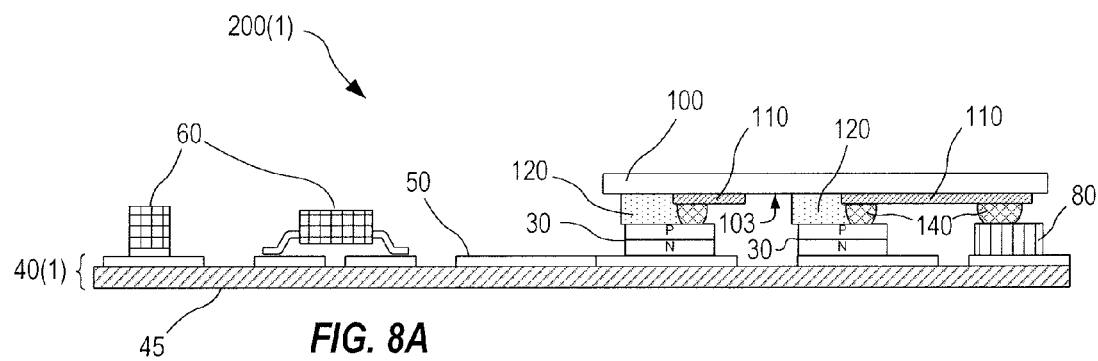
FIG. 8A shows a PCB assembly formed by mounting the cover plate shown in FIG. 7A, onto the PCB shown in FIG. 4, in accord with an embodiment.
Figure 8B:
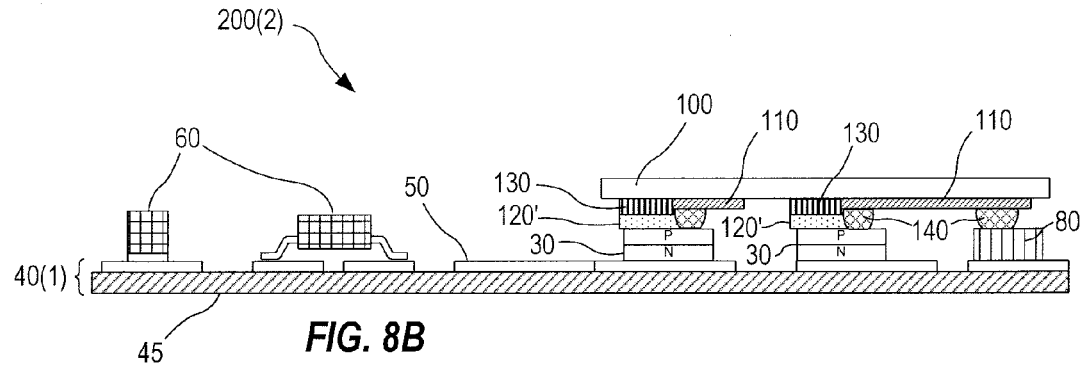
FIG. 8B shows a PCB assembly formed by mounting the cover plate shown in FIG. 7B, onto the PCB shown in FIG. 4, in accord with an embodiment.

FIG. 5A is a side view of conductors 110 on a bottom surface 103 of a cover plate 100 (the terms "bottom surface" and "top surface" are understood as being in reference to a final configuration of cover plate 100 atop PCB 40, as shown in FIGS. 8A and 8B). Cover plate 100 may be formed of quartz, glass, sapphire, plastic, Mylar, polycarbonate, acrylic, polyester, polyethylene and composites thereof, or other material that is transparent to light generated by LED chips 30. A specific material forming cover plate 100 may be chosen to have a coefficient of thermal expansion approximating that of substrate 45, to minimize the possibility of cracking or adhesive failure with environmental stresses such as temperature cycling or vibration. Conductors 110 may be formed of metal or may be formed of conductive but translucent or transparent materials (e.g., indium tin oxide). Conductors 110 may be formed by conventional methods such as masking and etching such that conductors 110 form a two-dimensional pattern on bottom surface 103 (see FIG. 5C). Besides conducting electrical voltages and/or currents, conductors 110 may be utilized for identification (e.g., part numbers, barcodes) or for visual recognition and positioning (e.g., fiducial marks for alignment of cover plate 100 to LED chips or a PCB). Cover plate 100 also has a top surface 105 upon which coatings may be applied, such as for example antireflective coatings to reduce light reflections at an air interface. Either of bottom surface 103 or top surface 105 may also be shaped, by methods known in the art such as molding, embossing, etching, engraving and/or blazing, to form optics such as lenses, gratings, Fresnel lenses and the like, to modify light passing therethrough by means of refraction or diffraction (see, for example, FIG. 12A and FIG. 12C).

Figure 5B:
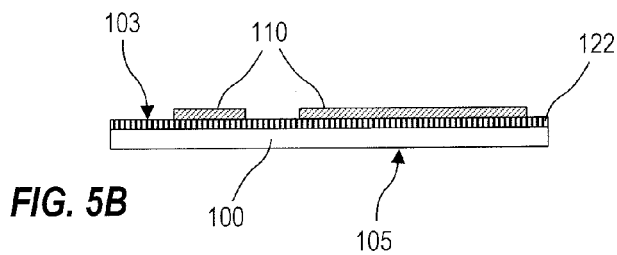
FIG. 5B is a side view of the cover plate with conductors of FIG. 5A, and shows a phosphor layer formed on a bottom surface of the cover plate, in accord with an embodiment.

FIG. 5B is a side view of cover plate 100, similar to FIG. 5A, but with conductors 110 formed on a phosphor layer 122 that covers bottom surface 103 of cover plate 100. Phosphor layer 122 may fluoresce when illuminated by LED chips 30, thus converting some of the light energy emitted by LED chips 30 into longer wavelengths to produce a better approximation of white light than the light emitted by LED chips 30 themselves. Phosphor layer 122 is shown in FIG. 5B on bottom surface 103, but it is understood that alternatively, phosphor layer 122 may be formed on top surface 105 of cover plate 100.

Figure 5C:
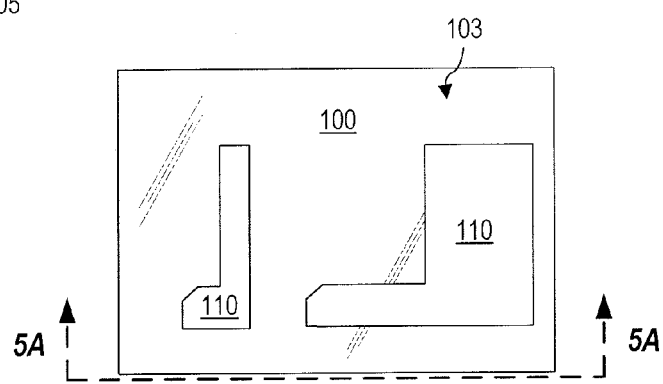
FIG. 5C shows a bottom view of the cover plate of FIG. 5A with the conductors formed as two-dimensional shapes on bottom surface thereof, in accord with an embodiment.

FIG. 5C shows a bottom view of cover plate 100 with conductors 110 formed as two-dimensional shapes on bottom surface 103 thereof. Broken line 5A-5A shows a line of sight along which the views of FIGS. 5A and 5B are taken.

Figure 6A:
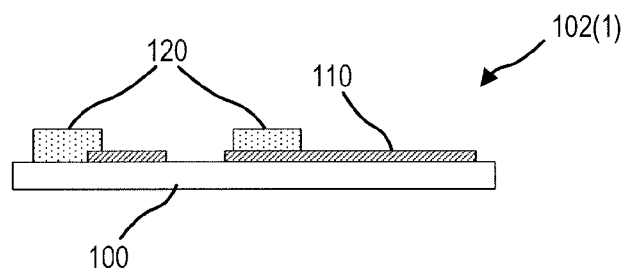
FIG. 6A is a side view of a cover plate subassembly that includes the cover plate of FIG. 5A with two sections of a conformal phosphor gel applied thereto, in accord with an embodiment.

FIG. 6A is a side view of a cover plate subassembly 102(1) that includes cover plate 100 and conductors 110 with two sections of a conformal phosphor gel 120 applied thereto. One or more phosphors, admixed with a gel to form phosphor gel 120, fluoresce under light emitted by LED chips 30, like phosphor layer 122, FIG. 5B, discussed above. Phosphor gel 120 may also be pliable so that, after assembly, it conforms to surface contours of LED chips 30. Portions of phosphor gels 120 are hidden in FIG. 6A behind conductor 110.

Figure 6B:
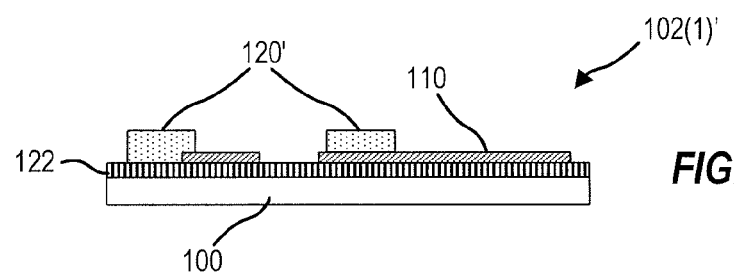
FIG. 6B is a side view of a cover plate subassembly that includes the cover plate of FIG. 5B with two sections of a conformal gel applied thereto, in accord with an embodiment.

FIG. 6B is a side view of a cover plate subassembly 102(1)' that includes cover plate 100 and conductors 110 with phosphor layer 122 (as in FIG. 5B) and two sections of a conformal gel 120' applied thereto. Utilizing phosphor layer 122 with conformal gel sections 120' may promote manufacturing flexibility and reduced cost, since it may not be necessary to remove phosphor layer 122 from areas that do not face LED chips in a final product, but conformal gel sections 120' can be patterned to match an LED layout of a particular product design.

Figure 6C:
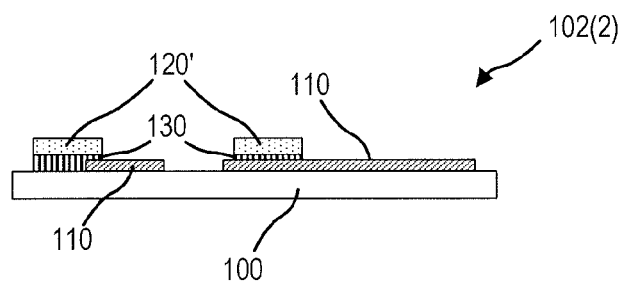
FIG. 6C is a side view of a cover plate subassembly that includes the cover plate of FIG. 5A with two sections of conformal gel and a phosphor layer applied thereto, in accord with an embodiment.

FIG. 6C is a side view of a cover plate subassembly 102(2) having cover plate 100 with two sections of conformal gel 120' and two sections of a phosphor layer 130. Portions of phosphor layers 130 are hidden in FIG. 6C behind conductor 110. It is appreciated that positions of conformal gel 120' and phosphor layer 130 may be reversed from the positions shown in FIG. 6C, such that conformal gel 120' is in contact with cover plate 100. Phosphor gel 120, conformal gel 120' and phosphor layer 130 may be formed on cover plate 100 by known methods such as screen-printing and/or photolithography.

Figure 7A:
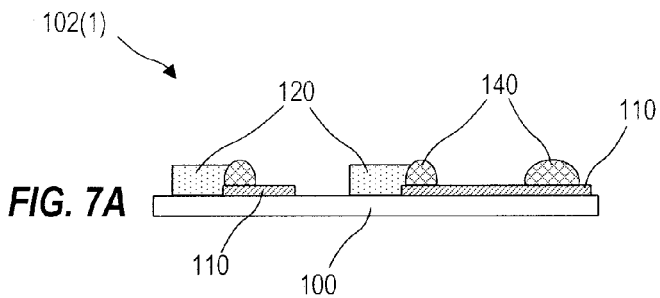
FIG. 7A shows a cover plate subassembly that includes the cover plate with conductors and phosphor gel of FIG. 6A, with a conductive epoxy applied in liquid form to the conductors, in accord with an embodiment.
Figure 7B:
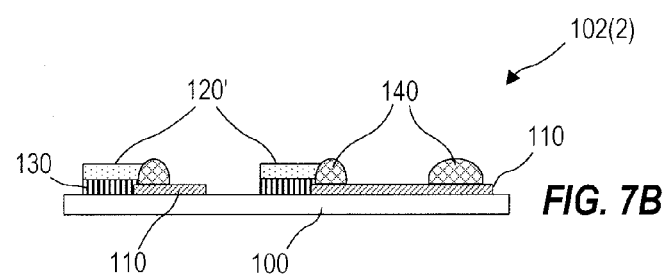
FIG. 7B shows a cover plate subassembly that includes the cover plate with conductors, conformal gel and phosphor layer of FIG. 6B, with a conductive epoxy applied in liquid form to the conductors, in accord with an embodiment.

FIG. 7A shows cover plate subassembly 102(1) (as shown in FIG. 6A) with conductive epoxy 140 applied in liquid form to locations on conductors 110 that correspond to circuit connections of LED chips 30 and standoff 80 on PCB 40(1) (as can be seen in FIG. 8A, for example—also see FIGS. 11A through 11C, 12A through 12C and 14A through 14C). FIG. 7B shows cover plate subassembly 102(2) (as shown in FIG. 6B) with conductive epoxy 140 applied in liquid form to conductors 110. As in FIG. 7A, conductive epoxy 140 is applied to locations of conductors 110 that correspond to the location of circuit connections of LED chips 30, and standoff 80, on PCB 40(1). It is understood that alternatively, conductive epoxy 140 may be applied to LED chips 30 and/or standoff 80 on PCB 40(1), in locations that correspond to conductors 110 on cover plate 100.

FIG. 8A shows a PCB assembly 200(1) formed by mounting cover plate subassembly 102(1), as shown in FIG. 7A, onto PCB 40(1), as shown in FIG. 4. Cover plate 100 is inverted relative to the position shown in FIG. 7A, aligned to PCB 40(1) such that conductive epoxy 140 contacts circuit connections of LED chips 30 and standoff 80 on PCB 40(1), and is held in this orientation until conductive epoxy 140 is hardened by using UV light and/or a thermal bake. FIG. 8B shows a PCB assembly 200(2) formed by mounting cover plate subassembly 102(2), as shown in FIG. 7B, onto PCB 40(1), as shown in FIG. 4. Alignment of cover plate 100 to PCB 40(1) and hardening of conductive epoxy 140 are done in similar manner for PCB assembly 200(2) as for assembly 200(1). When cover plate 100 and layers thereon are assembled to PCB 40(1) to form assemblies 200(1) and 200(2), gel 120 or 120' may compress to adjust for a total height between LED chips 30 and cover plate 100 so that LED chips 30 and cover plate 100 are well coupled optically (e.g., through gel 120, gel 120' and/or phosphor layer 130) but only couple mechanically (in a rigid sense) through conductive epoxy 140. That is, gel 120, gel 120' and/or phosphor layer 130 allow for optical coupling but provide a mechanical degree of freedom so that phenomena such as mechanical tolerances, thermal expansion and contraction, and the like do not exert unwanted force or pressure on LED chips 30.

It is contemplated that embodiments of cover plate subassemblies 102 herein may be utilized for circuitry (e.g., like a PCB) to any extent consistent with the use of the cover plate itself. For example, circuit components may be attached to conductors 110 in addition to, or instead of, such components attaching to PCB 40.

Figure 9A:
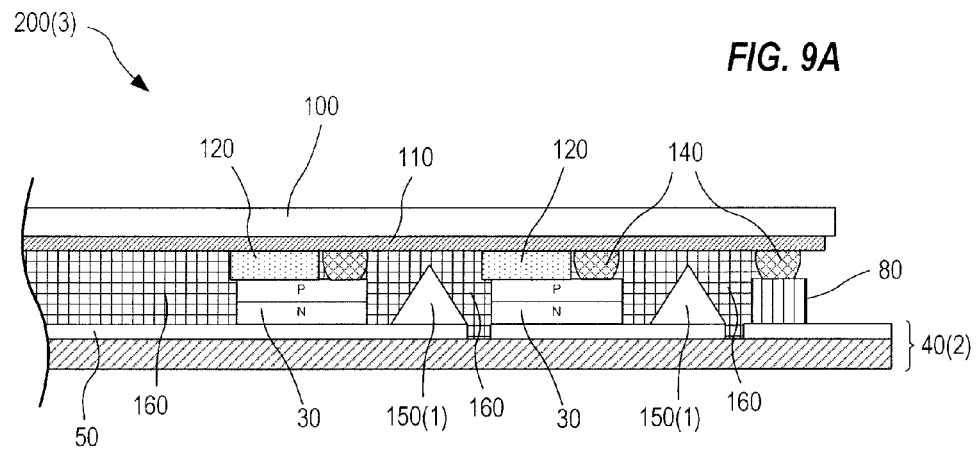
FIG. 9A shows a portion of a PCB assembly with reflectors, in accord with an embodiment.
Figure 9B:
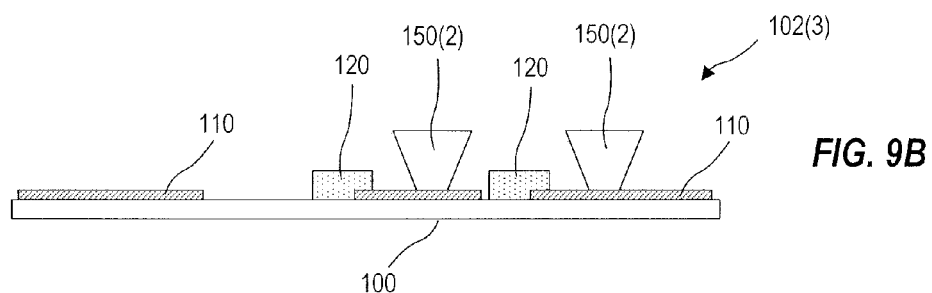
FIG. 9B shows a cover plate subassembly including reflectors, in accord with an embodiment.

Other materials or features may be incorporated into PCB assemblies 200 or components thereof, for enhanced reliability and/or performance. For example, FIG. 9A shows a portion of a PCB assembly 200(3) with reflectors 150(1). Reflectors 150(1) may be formed of metal (e.g., a stamped foil such as aluminum foil), a metal coated plastic (e.g., metalized Mylar) or micromachined silicon, and may mount with conductors 50, as shown, or may mount with cover plate 100, as shown in FIG. 9B. Reflectors 150(1) serve to increase efficiency of PCB assembly 200(3) by reflecting stray light and light emitted from sides of LED chips 30 up through cover plate 100. PCB assembly 200(3) also includes a fill material 160 that fills space between a PCB 40(2) and cover plate 100, except space occupied by components such as LED chips 30, standoff 80, phosphor gel 120 and conductive epoxy 140. Fill material 160 may be a gel, a fluid, epoxy, a UV curable material such as silicone, or a liquid crystal material. Fill material 160 advantageously protects and/or passivates exposed surfaces of LED chips 30 and keeps contaminants out of the space between PCB 40 and cover plate 100. When fill material 160 is liquid crystal material, conductors 50 and 110 may be utilized to activate the liquid crystal material to modulate reflectivity of PCB assembly 200(3). Alternatively, fill material 160 may have a refractive index matched to a refractive index of cover plate 100, thereby eliminating a Fresnel reflection that would otherwise occur at an interface between cover plate 100 and air at bottom surface 103 (e.g., see FIG. 8A).

Figure 9C:
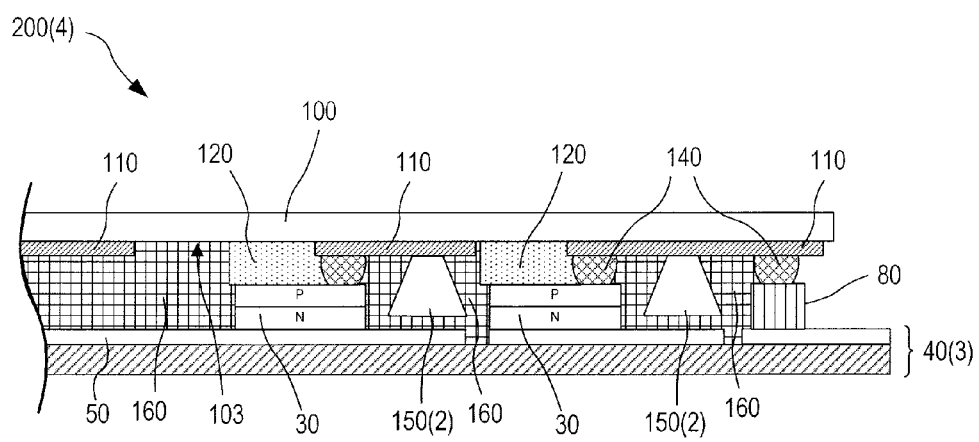
FIG. 9C shows a PCB assembly formed by mounting the cover plate subassembly of FIG. 9B to a PCB with LED chips, and filling the assembly with fill material, in accord with an embodiment.

FIG. 9B shows a cover plate subassembly 102(3) including reflectors 150(2). Like reflectors 150(1) shown in FIG. 9A, reflectors 150(2) may be formed of metal, a metal coated plastic or micromachined silicon. Reflectors 150(2) attach to conductors 110 of cover plate 100 such that when assembled to a PCB with LED chips mounted thereon, reflectors 150(2) are located between the LED chips and increase efficiency by reflecting light through cover plate 100. FIG. 9C shows a portion of a PCB assembly 200(4) formed by mounting cover plate subassembly 102(3) (shown in FIG. 9B) to a PCB 40(3) with LED chips 30, and filling the assembly with fill material 160.

Additionally to the use of reflectors and fill material, LED chips 30 may include features and materials that cooperate with the materials and construction method detailed above. For example, LED chips 30 may include a phosphor coating and/or index matching gel before mounting to a PCB 40; such coatings may be applied in wafer form for reduced cost. LED chips 30 may also be designed to include features such as fiducial marks that facilitate alignment of other structures thereto by humans or by machine vision (see for example FIG. 11A). Also, although FIGS. 4, 8A, 8B, 9A and 9C herein show LED chips 30 as having an N type bottom layer accessed through a backside contact and a P type top layer accessed through a frontside contact, it is appreciated that LED chips may include topside contacts for both P and N layers, as illustrated in FIGS. 12A through 12C and FIGS. 14A through 14C.

Other features that may be incorporated into PCB assemblies with LED chips facilitates alignment among the components thereof. A layout of a PCB assembly 200 may require alignment tolerances among the components thereof, leading to the layout being larger when the alignment tolerances are large. The larger layout may contribute to issues with performance (e.g., transferring heat away from the LED chips, inability to get as many LED chips as desired into a package of a given size) and/or reliability (e.g., larger cover plates and/or PCBs may be more susceptible to cracking or adhesive failure under stress). In particular, features that facilitate self-aligning assembly and/or machine vision for alignment purposes are now described.

Figure 10A:
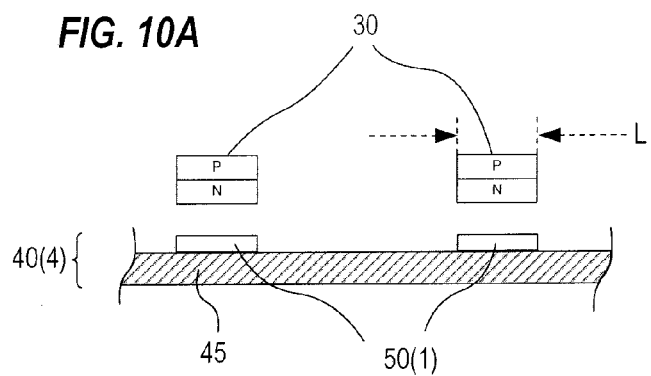
FIGS. 10A through 10C illustrate how solder reflow may be utilized to align LED chips to a PCB, in accord with an embodiment.
Figure 10B:
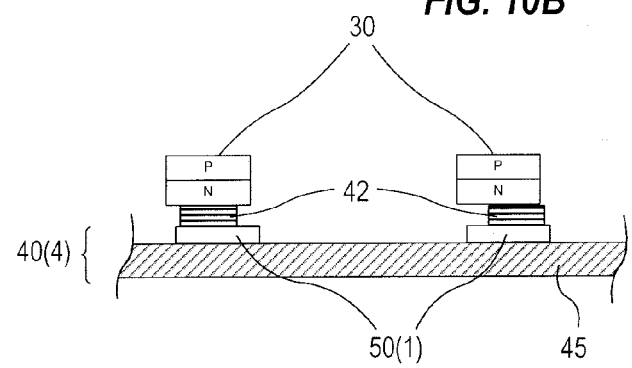
Figure 10C:
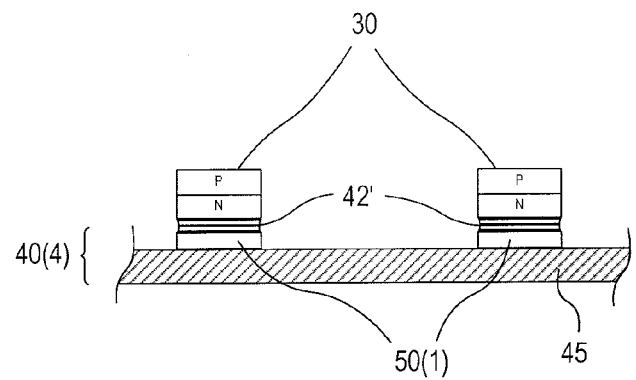

FIGS. 10A through 10C illustrate how solder reflow may be utilized to align LED chips to a PCB. FIG. 10A shows a portion of a PCB 40(4) that includes a substrate 45, and conductors 50(1) sized for coupling of LED chips 30 through self-aligning solder reflow. Solder may be supplied in the form of a slug that approximately matches the outline of conductors 50(1) where attachment of LED chips 30 is desired. FIG. 10B shows LED chips 30 and solder 42 placed onto conductors 50(1) with imperfect alignment; note that edges of LED chips 30 and solder 42 do not align vertically with edges of conductors 50(1). Solder 42 is then heated to a melting point of solder 42, which melts to form a liquid 42' having surface tension, as shown in FIG. 10C. The surface tension is minimized by reducing area about edges of LED chips 30 and conductors 50(1), pulling LED chips 30 into alignment with conductors 50(1). When liquid solder 42' cools and hardens into solid form, LED chips 30 remain aligned and couple with conductors 50(1). The term "solder" herein is not limited to lead-tin solder but encompasses all equivalent types of low melting point metals that may include, for example, lead, tin, copper, silver, bismuth, indium, zinc and antimony.

The approach illustrated in FIGS. 10A through 10C is particularly effective for smaller LED chips (e.g., LED chips with length and/or width less than 250 microns), as an aligning force generated in a given direction at the edges of liquid solder 42' is proportional to a peripheral length of each LED chip 30 transverse to that direction, while a mass of each LED chip 30 is proportional to an area of the chip. Therefore, for a square LED chip 30 having sides of length L (as shown in FIG. 10A) a ratio of the aligning force to the mass of a single LED chip 30 varies as $2L/L^2$. This ratio is larger for a smaller L, so a smaller LED chip is subject to a higher aligning force in proportion to its mass. It is also appreciated that alternatively, (1) solder 42 may be plated, or formed by deposition and etching, onto traces 50(1) where attachment of LED chips 30 is desired, and/or (2) conductors 50 may extend beyond a desired bonding area for LED chips 30, with a soldermask layer forming an opening at the desired bonding area.

Figure 11A:
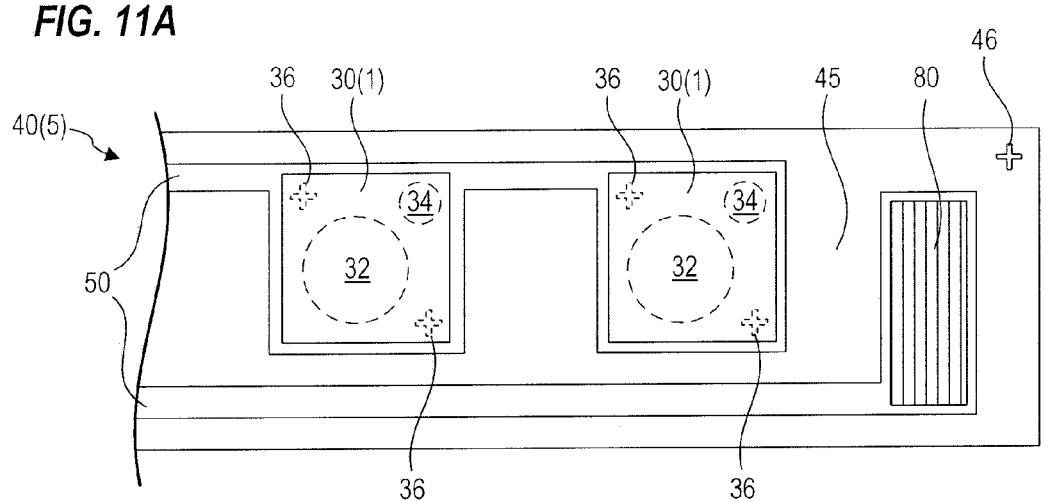
FIG. 11A is a plan view of a portion of a PCB with two LED chips and a standoff mounted thereon, for subsequent coupling with cover plate subassembly to form a PCB assembly, in accord with an embodiment.

FIG. 11A is a plan view of a portion of a PCB 40(5) with two LED chips 30(1) and standoff 80 mounted thereon, for subsequent coupling with cover plate subassembly 102(4) (see FIG. 11B) to form a PCB assembly. PCB 40(5) includes substrate 45, conductors 50 and a fiducial mark 46, as shown. LED chips 30(1) and standoff 80 couple with conductors 50 using solder and/or conductive epoxy. Although conductors 50 are shown as slightly overlapping LED chips 30(1) and standoff 80, this is for illustrative clarity and it is appreciated that conductors 50 may be laid out coincidentally with LED chips 30(1) and/or standoff 80 for purposes of self-aligning solder reflow, as discussed above in connection with FIGS. 10A through 10C. Each LED chip 30(1) is shown as having a light emitting area 32, a frontside contact 34 and fiducial marks 36 in dashed outline; it is appreciated that shape, size and position of light emitting area 32, a frontside contact 34 and fiducial marks 36 are matters of LED chip layout and may vary from the shapes shown.

Figure 11B:
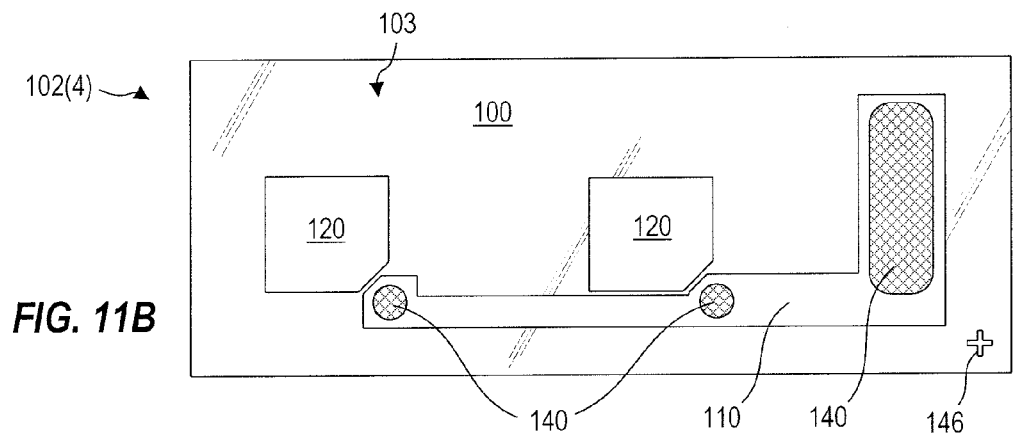
FIG. 11B is a plan view of a cover plate subassembly ready for coupling with the PCB of FIG. 11A to form a PCB assembly, in accord with an embodiment.

FIG. 11B is a plan view of a cover plate subassembly 102(4) ready for coupling with PCB 40(5) to form a PCB assembly. FIG. 11B shows bottom side 103 of cover plate subassembly 102(4) such that subassembly 102(4) would be turned over top-to-bottom to couple with PCB 40(5). Cover plate subassembly 102(4) includes cover plate 100 having a conductor 110, phosphor gels 120 and a fiducial mark 146. Conductive epoxy 140 is shown as being placed on conductor 110 such that epoxy 140 will face frontside contacts 34 and standoff 80 when subassembly 102(4) couples with PCB 40(5).

Figure 11C:
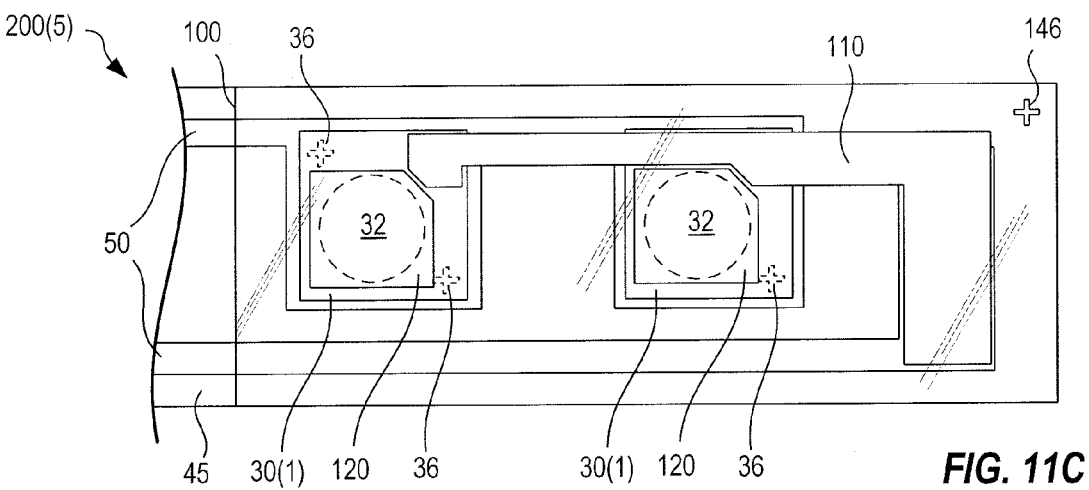
FIG. 11C shows the cover plate subassembly of FIG. 11B coupled with the PCB of FIG. 11A, to form a PCB assembly, in accord with an embodiment.

FIG. 11C shows cover plate subassembly 102(4), FIG. 11B, coupled with PCB 40(5), FIG. 11A, to form PCB assembly 200(5). Since cover plate 100 is transparent, most elements shown in FIG. 11A and FIG. 11B remain visible, but conductor 110 is opaque, hiding conductive epoxy 140, frontside contacts 34 and one instance of fiducial mark 36 in FIG. 11C. Alignment of cover plate subassembly 102(4) to PCB 40(5) includes aligning fiducial mark 146 (FIG. 11B) to fiducial mark 46 (FIG. 11A) so that fiducial mark 46 is also hidden beneath fiducial mark 146 in FIG. 11C.

Figure 12A:
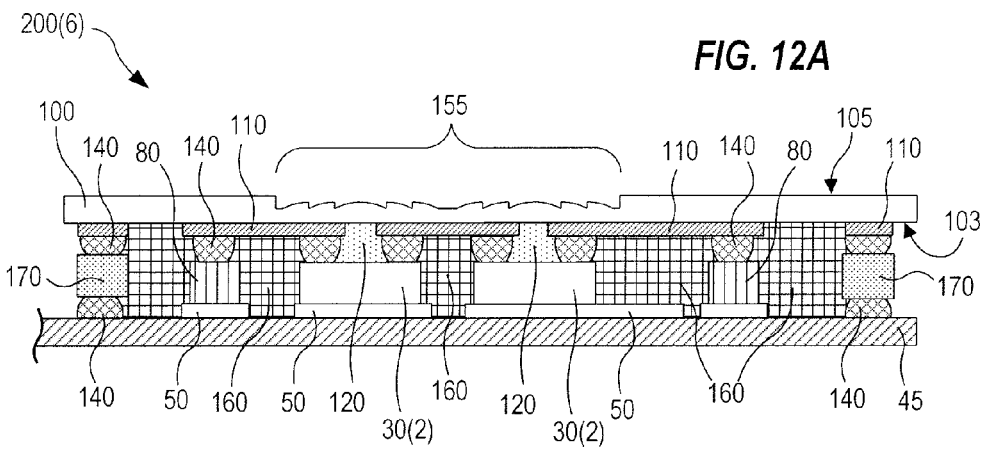
FIG. 12A shows a cross-sectional view of a PCB assembly, in accord with an embodiment.
Figure 12B:
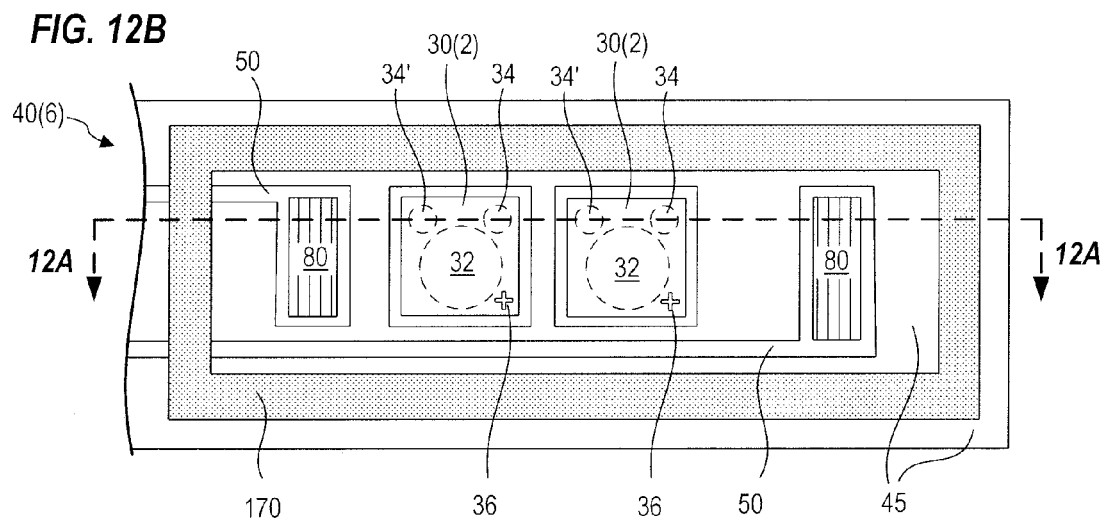
FIG. 12B shows a PCB with LED chips, standoffs and insulating dam attached thereto, ready for attachment to a cover plate subassembly to form the PCB assembly of FIG. 12A.
Figure 12C:
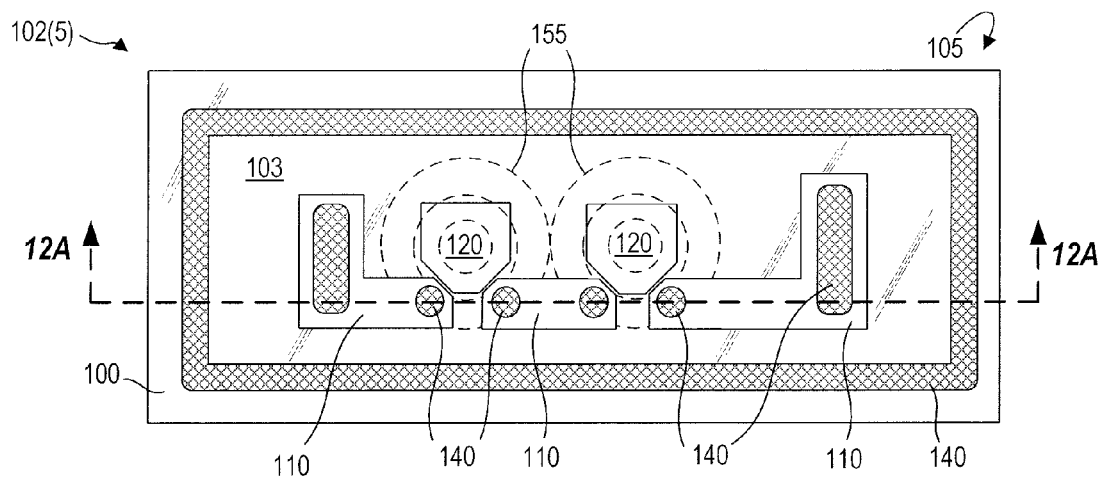
FIG. 12C shows cover plate subassembly with multiple instances of conductors, phosphor gel and conductive epoxy ready for alignment to, and coupling with, the PCB of FIG. 12B to form the PCB assembly of FIG. 12A.

FIG. 12A shows a cross-sectional view of a PCB assembly 200(6). PCB assembly 200(6) has two LED chips 30(2) that each couple to a PCB 40(6) (FIG. 12B) and, using two instances of conductive epoxy per LED chip 30(2), to a cover plate subassembly 102(5) (FIG. 12C). PCB assembly 200(6) also includes an insulating dam 170 for containing fill material 160. Dam 170 is shown in FIG. 12A as attached to PCB 40(6) and to cover plate assembly 102(5) using epoxy 140; in other embodiments dam 170 may be formed of an electrically conductive material and may attach to a PCB and/or a cover plate using solder. FIG. 12A also illustrates optics 155 in the form of a Fresnel lens formed into top surface 105 of cover plate 100. FIG. 12B shows PCB 40(6) with LED chips 30(2), standoffs 80 and insulating dam 170 attached thereto. FIG. 12C shows cover plate subassembly 102(5) with multiple instances of conductors 110, phosphor gel 120 and conductive epoxy 140 ready for alignment to, and coupling with, PCB 40(6) (FIG. 12B). FIG. 12C shows cover plate subassembly 102(5) from the perspective of facing bottom side 103 of cover plate 100; optics 155 are therefore shown in dashed lines where visible through transparent cover plate 100 and phosphor gel 120 in top surface 105 (see FIG. 12A). Sight lines 12A-12A in each of FIG. 12B and FIG. 12C indicate the plane at which the cross-sectional view of FIG. 12A is taken.

Figure 13:
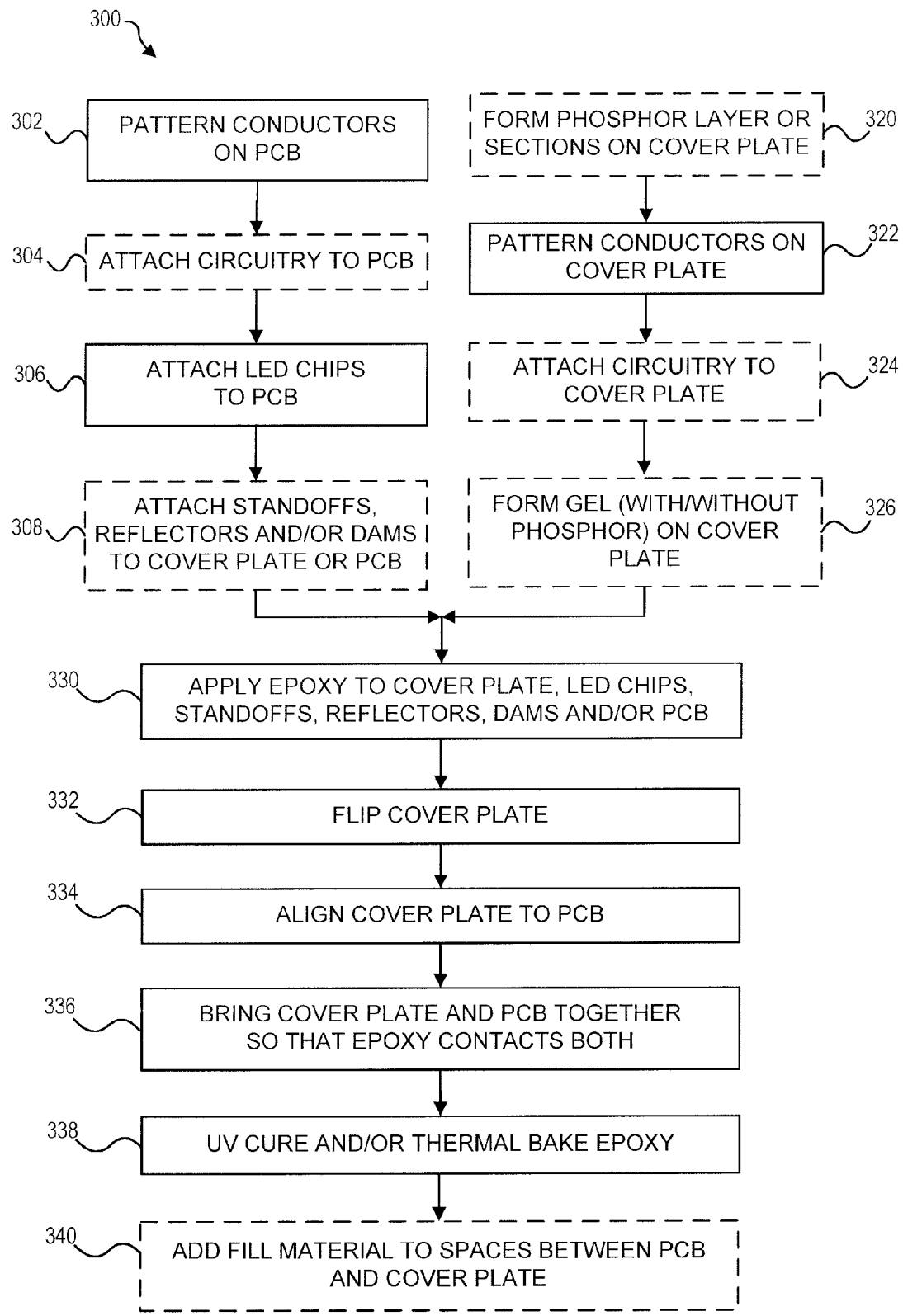
FIG. 13 is a flowchart showing steps of a method of assembling a PCB assembly with LED chips, in accord with an embodiment.

FIG. 13 is a flowchart showing steps of a method 300 of assembling a PCB assembly with LED chips. Method 300 may, for example, be utilized to assemble PCB assembly 200. Steps 302 through 308 assemble a PCB portion of the PCB assembly, while steps 320 through 326 assemble a cover plate subassembly independently of the PCB portion. Steps 330 through 340 join the cover plate portion to the PCB portion to form the completed PCB assembly.

Step 302 patterns conductors on a PCB (e.g., patterns conductors 50 on PCB 40) using known methods of PCB fabrication. An optional step 304, shown in a dashed box, attaches circuitry (e.g., circuit components 60) to the PCB, either by soldering or by attaching the circuitry to the PCB using conductive epoxy. Step 304 is not applicable for products where circuit components are not needed or are not implemented on the same PCB as the LED chips (e.g., when PCB 40 includes only LED chips, and circuit functionality is implemented elsewhere). Step 306 attaches LED chips (e.g., LED chips 30) to the PCB. An optional step 308 attaches one or more standoffs (e.g., standoff 80), reflectors (e.g., reflector 150) and/or dams (e.g., dam 170) to the PCB. Steps 306 and 308 may utilize solder and/or conductive epoxy; when epoxy is used, the corresponding step may include a thermal bake or UV cure to harden the epoxy.

An optional step 320, shown in a dashed box, forms a phosphor layer (e.g., layer 122) or phosphor sections (e.g., phosphor layers 130) on a cover plate (e.g., on cover plate 100). Step 322 patterns conductors on the cover plate (e.g., patterns conductors 110). An optional step 324 attaches circuitry to the cover plate. An optional step 326 forms a conformal index matching gel (e.g., gel 120, 120') on the cover plate. Step 326 may be omitted (a) for cost savings, (b) when the LED chips being assembled include index matching gel and/or phosphor coating applied in wafer form, and/or (c) when fill material is to be utilized for purposes similar to those of the index matching gel.

Step 330 applies conductive epoxy to conductors, LED chips, reflectors, dams and/or standoffs on one or both of (a) the PCB prepared as in steps 302 through 308, and (b) the cover plate subassembly prepared as in steps 320 through 326. Step 332 flips over the cover plate subassembly such that the conductive epoxy applied in step 330 faces the corresponding locations on the other of the cover plate portion and the PCB. Step 334 aligns the cover plate subassembly with the PCB. Step 336 moves the cover plate subassembly and the PCB portion together such that the epoxy couples the appropriate locations on the PCB and its components, with the appropriate locations on the cover plate subassembly It is appreciated that steps 334 and 336 may be iterated, combined, or performed in a different order than that shown in FIG. 9. For example, a crude alignment may be performed first, followed by a crude approach of the cover plate subasssembly to the PCB (at which point the conductive epoxy may or may not be in contact with both the cover plate subasssembly and the PCB), followed by a fine alignment, followed by bringing the cover plate portion and the PCB portion together to a final distance from one another. Step 338 utilizes UV light or a thermal bake to cure the conductive epoxy applied in step 330, to complete the assembly of the PCB assembly. An optional step 340 applies fill material to spaces between the PCB and the cover plate, as described in connection with FIG. 9A.

Figure 14A:
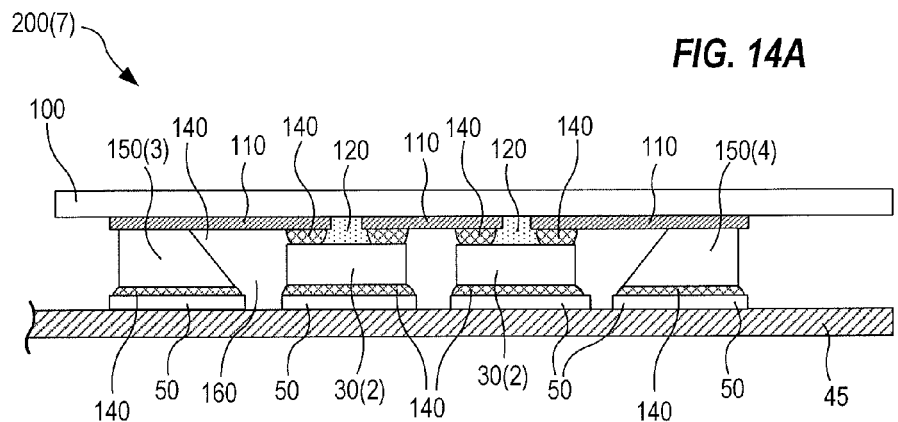
FIG. 14A shows a cross-sectional view of a PCB assembly that includes two LED chips that each couple to a PCB and to a cover plate subassembly, in accord with an embodiment.
Figure 14B:
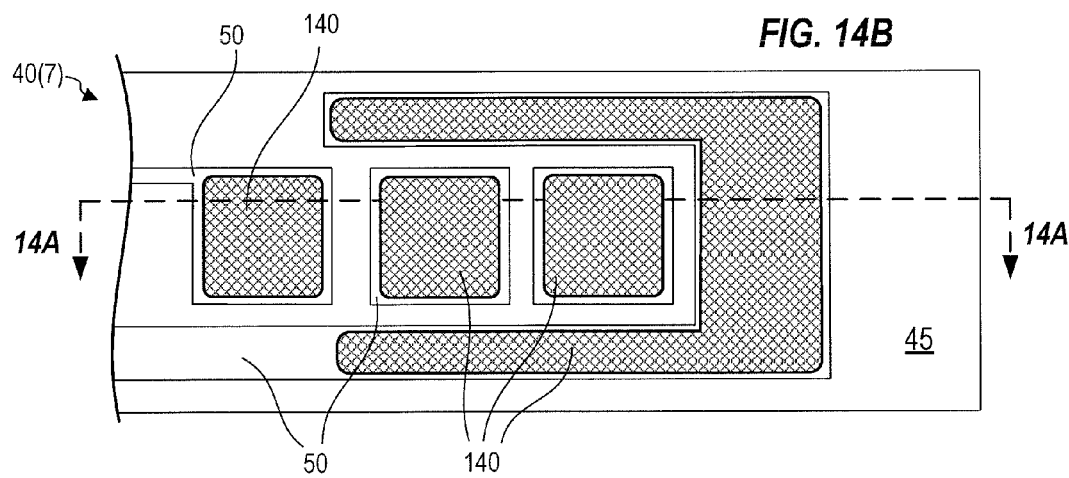
FIG. 14B shows a PCB with conductive epoxy applied in locations facing LED chips and reflectors of a cover plate subassembly, during assembly of the PCB assembly of FIG. 14A.
Figure 14C:
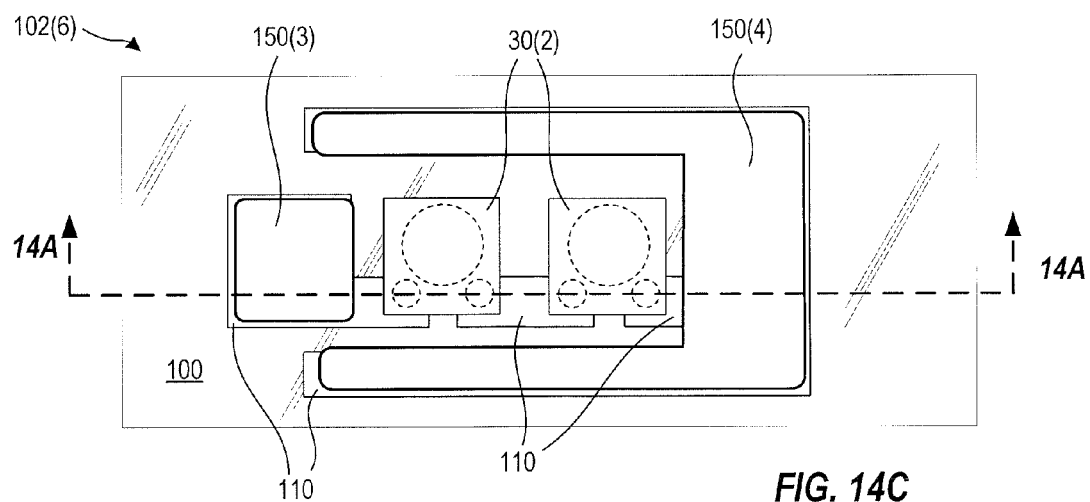
FIG. 14C shows a cover plate subassembly with multiple instances of conductors, LED chips and reflectors attached thereto, ready for attachment to the PCB of FIG. 14B to form the PCB assembly of FIG. 14A.

FIG. 14A shows a cross-sectional view of a PCB assembly 200(7) that includes two LED chips 30(2) that each couple to a PCB 40(7) (see FIG. 14B) and to a cover plate subassembly 102(6) (see FIG. 14C). PCB assembly 200(7) is manufactured by attaching LED chips 30(2) to cover plate subassembly 102(6) before cover plate assembly 102(6) attaches to PCB assembly 200(7), as described below. PCB assembly 200(7) also includes reflectors 150(3) and 150(4) that each have a height that is sufficient for the reflectors to function as standoffs, that is, to set a distance between PCB 40(7) and a cover plate 100 (see FIG. 14C). FIG. 14B shows PCB 40(7) with conductors 50 and conductive epoxy 140 applied in locations facing LED chips 30(2) and reflectors 150(3) and 150(4) as shown in FIG. 14C. FIG. 14C shows cover plate subassembly 102(6) with multiple instances of conductors 110 fabricated thereon, and with LED chips 30(2) and reflectors 150(3) and 150(4) attached thereto. Dashed lines within LED chips 30(2) show positions of light emitting areas and frontside contacts that are on the underside of LED chips 30(2), that is, facing cover plate 100. Sight lines 14A-14A in each of FIG. 14B and FIG. 14C indicate the plane at which the cross-sectional view of FIG. 14A is taken.

Figure 15:
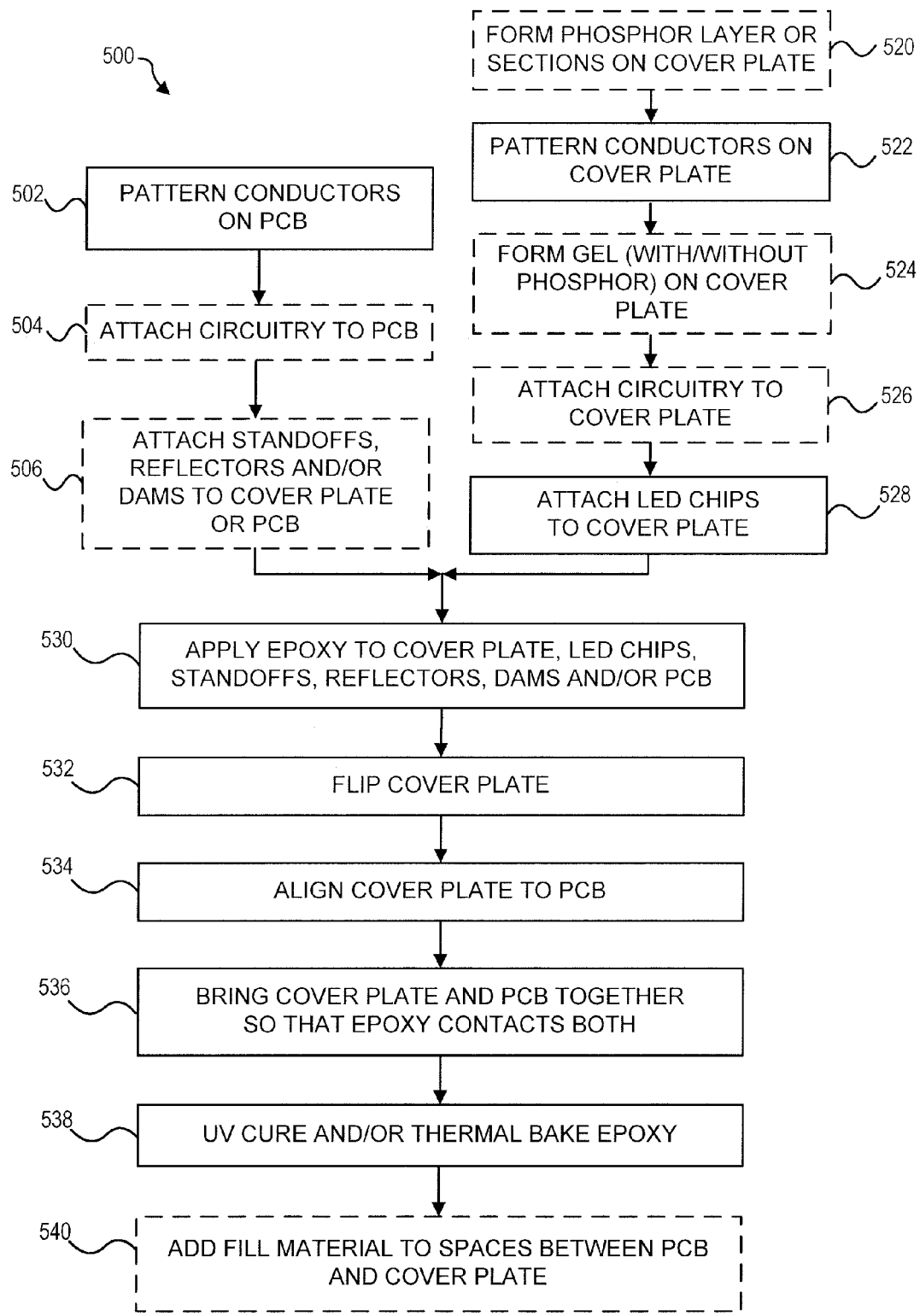
FIG. 15 is a flowchart showing steps of a method 500 of assembling a PCB assembly with LED chips, in accord with an embodiment.

FIG. 15 is a flowchart showing steps of a method 500 of assembling a PCB assembly with LED chips. Method 500 may, for example, be utilized to assemble PCB assembly 200. Steps 502 through 506 assemble a PCB portion of the PCB assembly, while steps 520 through 528 assemble a cover plate subassembly independently of the PCB portion. Steps 530 through 540 join the cover plate portion to the PCB portion to form the completed PCB assembly.

Step 502 patterns conductors on a PCB (e.g., patterns conductors 50 on PCB 40) using known methods of PCB fabrication. An optional step 504, shown in a dashed box, attaches circuitry (e.g., circuit components 60) to the PCB, either by soldering or by attaching the circuitry to the PCB using conductive epoxy. Step 504 is not applicable for products where circuit components are not needed or are not implemented on the same PCB as the LED chips (e.g., when PCB 40 includes only LED chips, and circuit functionality is implemented elsewhere). Optional step 506 attaches one or more standoffs (e.g., standoff 80), reflectors (e.g., reflector 150) and/or dams (e.g., dam 170) to the PCB. Step 506 may utilize solder and/or conductive epoxy; when epoxy is used, the corresponding step may include a thermal bake or UV cure to harden the epoxy.

An optional step 520, shown in a dashed box, forms a phosphor layer (e.g., layer 122) or phosphor sections (e.g., phosphor layers 130) on a cover plate (e.g., on cover plate 100). Step 522 patterns conductors on the cover plate (e.g., patterns conductors 110). An optional step 524 forms a conformal index matching gel (e.g., gel 120, 120') on the cover plate. Step 524 may be omitted (a) for cost savings, (b) when the LED chips being assembled include index matching gel and/or phosphor coating applied in wafer form, and/or (c) when fill material is to be utilized for purposes similar to those of the index matching gel. An optional step 526 attaches circuitry to the cover plate. Step 528 attaches the LED chips to the cover plate.

Step 530 applies conductive epoxy to one or the other of conductors, LED chips, reflectors, dams and/or standoffs on the PCB prepared as in steps 502 through 506, and/or the cover plate subassembly prepared as in steps 520 through 524. Step 532 flips over the cover plate subassembly such that the conductive epoxy applied in step 530 faces the corresponding locations on the other of the cover plate portion and the PCB. Step 534 aligns the cover plate subassembly with the PCB. Step 536 moves the cover plate subassembly and the PCB portion together such that the epoxy couples the appropriate locations on the PCB and its components, with the appropriate locations on the cover plate subassembly. It is appreciated that steps 534 and 536 may be iterated, combined or performed in a different order than that shown in FIG. 9. For example, a crude alignment may be performed first, followed by a crude approach of the cover plate subasssembly to the PCB (at which point the conductive epoxy may or may not be in contact with both the cover plate subasssembly and the PCB), followed by a fine alignment, followed by bringing the cover plate portion and the PCB portion together to a final distance from one another. Step 538 utilizes UV light or a thermal bake to cure the conductive epoxy applied in step 530, to complete the assembly of the PCB assembly. An optional step 540 applies fill material to spaces between the PCB and the cover plate, as described in connection with FIG. 9A.

The changes described above, and others, may be made in the chip-on-board packaging methods and systems described herein without departing from the scope hereof. For example, although embodiments herein have been illustrated with drawings showing two LED chips, it should be clear that any number of LED chips may be incorporated into an LED based lighting product and that such chips may be arranged linearly, in two dimensional arrays or in stochastic two dimensional layouts. The embodiments herein are not limited to specific types of electrical routing shown in the drawings; LED chips may for example be connected in series or in parallel, using any number of conductors on PCBs or cover plates, to connect topside or backside contacts. Phosphor layers and types may be single or multiple (for example, to provide multiple fluorescence wavelengths for broad spectrum light) and phosphors may be admixed with conformal gels, index matching gels, fill material or cover plate materials. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A light emitting diode LED-based lighting product, comprising:
    a printed circuit board PCB with one or more LED chips mounted directly thereon; and
    a cover plate having conductors that couple to the LED chips and the PCB such that the conductors form electrical connections between the one or more LED chips and the PCB; and a phosphor layer between the one or more LED chips and the cover plate, such that light emitted by the one or more LED chips causes the phosphor layer to fluoresce.

2. The LED-based lighting product of claim 1, wherein the phosphor layer is removed except where the one or more LED chips face the cover plate.

3. The LED-based lighting product of claim 1, the cover plate comprising a phosphor.

4. The LED-based lighting product of claim 1, further comprising a conformal gel between the one or more LED chips and the cover plate.

5. The LED-based lighting product of claim 4, the conformal gel having a refractive index that is matched to that of the cover plate.

6. The LED-based lighting product of claim 4, further comprising a phosphor admixed with the conformal gel, such that light emitted by the one or more LED chips causes the phosphor to fluoresce.

7. The LED-based lighting product of claim 1, further comprising a standoff attached to both the PCB and the cover plate, the standoff defining a distance between the PCB and the cover plate.

8. The LED-based lighting product of claim 7, the standoff forming an electrical connection between the PCB and one or more of the conductors.

9. The LED-based lighting product of claim 1, further comprising a reflector attached to at least one of the PCB and the cover plate.

10. The LED-based lighting product of claim 9, wherein the reflector attaches to both of the PCB and the cover plate, and defines a distance between the PCB and the cover plate.

11. The LED-based lighting product of claim 9, the reflector forming an electrical connection between the PCB and one or more of the conductors.

12. The LED-based lighting product of claim 1, further comprising fill material between the PCB and the cover plate.

13. The LED-based lighting product of claim 1, the cover plate comprising one of glass, quartz, sapphire, plastic, Mylar, polycarbonate, acrylic, polyester and polyethylene.

14. The LED-based lighting product of claim 1, the cover plate comprising a material having a coefficient of thermal expansion matching that of the PCB.

15. The LED-based lighting product of claim 1, the cover plate forming optics that modify light passing therethrough.

16. The LED-based lighting product of claim 1, the one or more LED chips comprising a plurality of LED chips.

17. The LED-based lighting product of claim 16, the plurality of LED chips arranged as an array on the PCB.

18. The LED-based lighting product of claim 16, the plurality of LED chips arranged stochastically on the PCB.

19. The LED-based lighting product of claim 1, the one or more LED chips having a length and width of approximately 250 microns or less.

* * * * *

UNITED STATES PATENT AND TRADEMARK OFFICE
CERTIFICATE OF CORRECTION

PATENT NO. : 7,791,089 B2
APPLICATION NO. : 12/198662
DATED : September 7, 2010
INVENTOR(S) : Jeffrey Bisberg It is certified that error appears in the above-identified patent and that said Letters Patent is hereby corrected as shown below:

Column 10, Lines 57-60 (Claim 1, lines 1-4),
"1. A light emitting diode LED-based lighting product, comprising:
  a printed circuit board PCB with one or more LED chips mounted directly thereon; and" should read,
--1. A light emitting diode (LED)-based lighting product, comprising:
  a printed circuit board (PCB) with one or more LED chips mounted directly thereon;--

Signed and Sealed this

Ninth Day of November, 2010

David J. Kappos
*Director of the United States Patent and Trademark Office*